United States Patent
Ryu et al.

(10) Patent No.: US 10,565,936 B2
(45) Date of Patent: Feb. 18, 2020

(54) ORGANIC LIGHT EMITTING DISPLAY DEVICE AND THE METHOD FOR DRIVING THE SAME

(71) Applicant: LG Display Co., Ltd., Seoul (KR)

(72) Inventors: SungBin Ryu, Paju (KR); JunHo Lee, Paju (KR); YoungJang Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 139 days.

(21) Appl. No.: 15/833,793

(22) Filed: Dec. 6, 2017

(65) Prior Publication Data
US 2018/0158418 A1  Jun. 7, 2018

(30) Foreign Application Priority Data
Dec. 7, 2016  (KR) .................. 10-2016-0165713

(51) Int. Cl.
*G09G 3/3266*  (2016.01)
*H01L 27/32*  (2006.01)
*G09G 3/3275*  (2016.01)

(52) U.S. Cl.
CPC ....... *G09G 3/3266* (2013.01); *H01L 27/3276* (2013.01); *G09G 3/3275* (2013.01); *G09G 2310/061* (2013.01); *G09G 2310/08* (2013.01); *G09G 2320/0257* (2013.01); *G09G 2354/00* (2013.01)

(58) Field of Classification Search
CPC ............... G09G 3/3266; G09G 3/3225; G09G 2340/0435; G09G 2320/08; G09G 2320/0606; G09G 2310/08; G09G 3/3275; G09G 2320/0257; G09G 2310/061; G09G 2354/00; H01L 27/3276
See application file for complete search history.

(56) References Cited

U.S. PATENT DOCUMENTS

| | | | |
|---|---|---|---|
| 2008/0055318 A1 | 3/2008 | Glen | |
| 2014/0368484 A1* | 12/2014 | Tanaka | G09G 3/3648 345/208 |
| 2016/0078838 A1* | 3/2016 | Huang | G09G 5/001 345/520 |
| 2016/0274690 A1 | 9/2016 | Tripathi et al. | |

FOREIGN PATENT DOCUMENTS

KR  10-2016-0081424 A  7/2016

\* cited by examiner

*Primary Examiner* — Andrew Sasinowski
(74) *Attorney, Agent, or Firm* — Polsinelli PC (57) ABSTRACT

An organic light emitting display device and a driving method thereof are provided. The organic light emitting display device comprising a display panel including a plurality of pixels, each pixel including an organic light emitting element, a data driver supplying a data signal to the organic light emitting element through a data line, a gate driver supplying a gate signal to the organic light emitting element through a gate line, and a timing controller controlling an operation timing of the data driver and an operation timing of the gate driver, and generating a conversion control signal controlling a conversion timing of a refresh rate of the display panel in response to an external input signal of the display panel.

19 Claims, 5 Drawing Sheets

ORGANIC LIGHT EMITTING DISPLAY DEVICE AND THE METHOD FOR DRIVING THE SAME

CROSS REFERENCE TO RELATED APPLICATION

This application claims the benefit of the Korean Patent Application No. 10-2016-0165713 filed on Dec. 7, 2016, which is hereby incorporated by reference in its entirety as if fully set forth herein.

BACKGROUND

Field of the Disclosure

The present disclosure relates to a display device, and more particularly, to an organic light emitting display device and a driving method thereof, capable of improving image quality.

Description of the Background

A flat panel display (FPD) has been employed in various electronic devices such as mobile phones, tablets, laptop computers, televisions and monitors. Generally, FPDs include a liquid crystal display (LCD) device and an organic light emitting display (OLED) device. Such a display device includes a pixel array including a plurality of pixels, in which an image is displayed and a driving circuit that controls light to be transmitted or emitted in each of the plurality of pixels. The driving circuit of the display device includes a data driver for supplying a data signal to the data lines of the pixel array, a gate driver for supplying a gate signal (or a scan signal) synchronized with the data signal to the gate lines (or scan lines) and a timing controller for controlling the gate driver (or scan driver) and the data driver.

In detail, the organic light emitting display device is a self-emissive display device, unlike a liquid crystal display device, a separate light source is not required, and thus it can be manufactured in a light and thin profile. And, the organic light emitting display device is not only advantageous in view of power consumption due to a low voltage driving, but also has excellent color reproduction, response speed, viewing angle, and contrast ratio (CR) and is being studied as a next generation display device in various fields. And, since the organic light emitting element has a surface emission structure, it can be readily realized in a flexible form.

The organic light emitting display having the above advantages displays an image over a plurality of frames based on an image data signal. In addition, the organic light emitting display device can output a plurality of frames while varying a refresh rate. Various methods for driving such an organic light emitting display device have been developed. Recently a driving method of a display panel of an organic light emitting display device for variously varying the refresh rate has been studied.

SUMMARY

The inventor of the present disclosure has found that various problems may occur when varying a refresh rate of the display panel displaying a video through a plurality of frames. In detail, when the user manually changes the refresh rate through an arbitrary button, a problem may arise that a new image may be blended into the image of the previous frame. Accordingly, the present disclosure is to provide an organic light emitting display device and a driving method thereof capable of reducing a blending problem of the image frames.

Accordingly, the present disclosure is to provide an organic light emitting display device and a driving method thereof capable of reducing the image blending problem occurring at the time of refresh rate conversion by generating a conversion control signal configured to control the refresh rate conversion according to a user's refresh rate conversion input.

In addition, the present disclosure is to provide an organic light emitting display device and a driving method thereof capable of suppressing the image blending problem by maintaining the driving frequency of the frame in which the external input signal is received to the next frame in response to the external input signal for converting the refresh rate.

It should be noted that the present disclosure is not limited to the above-described, and other features and advantages of the present disclosure will be apparent to those skilled in the art from the following descriptions.

According to an aspect of the present disclosure, there is provided an organic light emitting display device comprising a display panel including a plurality of pixels, each pixel including an organic light emitting element, a data driver supplying a data signal to the organic light emitting element through a data line, a gate driver supplying a gate signal to the organic light emitting element through a gate line, and a timing controller controlling an operation timing of the data driver and an operation timing of the gate driver, and generating a conversion control signal controlling a conversion timing of a refresh rate of the display panel in response to an external input signal of the display panel. The organic light emitting display device according to an aspect of the present disclosure can generate a conversion control signal for controlling the refresh rate conversion according to the user's refresh rate conversion input so as to suppress the image blending problem (i.e., mixing problem) in the refresh rate conversion of the organic light emitting display device.

According to an aspect of the present disclosure, a driving method of an organic light emitting display device comprises changing a conversion control signal to change a conversion timing of a refresh rate of a display panel from a low state to a high state in response to an external input signal of the display panel, counting a vertical synchronization signal while the conversion control signal is in the high state, and changing the conversion control signal from the high state to the low state when the number of count in pulses of the vertical synchronization signal reaches a predetermined number of pulses. An organic light emitting display device according to an aspect of the present disclosure includes a step for driving the organic light emitting display device in response to an external input signal of refresh rate conversion, wherein the driving frequency of the frame when the external input signal is received is maintained until the next frame, thereby reducing the power consumption of the organic light emitting display device and reducing the image blending phenomenon.

According to another aspect of the present disclosure, the organic light emitting display device including a display panel including a plurality of pixels and a timing controller adjusting a refresh rate of the display panel by applying a vertical synchronization signal having an adjustable refresh rate to the plurality of pixels according to an asynchronized conversion control signal. The timing controller receives the asynchronized conversion control signal at a specific timing, counts the number of pulses of the vertical synchronization signal after an input of the conversion control signal until a predetermined number of pulses is reached, and drives the display panel at a refresh rate corresponding to the conversion control signal when the counted number of pulses of the vertical synchronization signal is equal to the predetermined number of pulses.

The details of other aspects are included in the detailed description and drawings.

According to the present disclosure, by generating a conversion control signal for controlling the refresh rate conversion in accordance with the user's refresh rate conversion input so as to suppress the image mixing problem (i.e., image blending problem) in the refresh rate conversion in the organic light emitting display device.

In addition, according to the present disclosure, in response to an external input signal for refresh rate conversion, the power consumption of the organic light emitting display device is reduced by driving the organic light emitting display device by maintaining a frame rate of a frequency prior to receiving an external input signal until the next frame, thereby reducing the image mixing phenomenon.

The effects according to the aspects of the present disclosure are not limited by the contents described above, and more various effects are included in the detailed description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure and methods for accomplishing the same will be more clearly understood from exemplary aspects described below with reference to the accompanying drawings. However, the present disclosure is not limited to the following exemplary aspects but may be implemented in various different forms. The exemplary aspects are provided only to complete disclosure of the present disclosure and to fully provide a person having ordinary skill in the art to which the present disclosure pertains with the category of the disclosure and the present disclosure will be defined by the appended claims.

The shapes, sizes, ratios, angles, numbers and the like illustrated in the accompanying drawings for describing the exemplary aspects of the present disclosure are merely examples and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including", "having", and "comprising" used herein are generally intended to allow other components to be added unless the terms are used with the term "only". Any references to singular may include plural unless expressly stated otherwise.

Components are interpreted to include an ordinary error range or an ordinary tolerance range even if not expressly stated.

When the position relation between two parts is described using the terms such as "on", "above", "below" and "next", on or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second" and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various aspects of the present disclosure can be partially or entirely bonded to or combined with each other and can be interlocked and operated in technically various ways as can be fully understood by a person having ordinary skill in the art, and the aspects can be carried out independently of or in association with each other.

Various aspects of the present disclosure will be described in detail with reference to the accompanying drawings.

Figure 1:
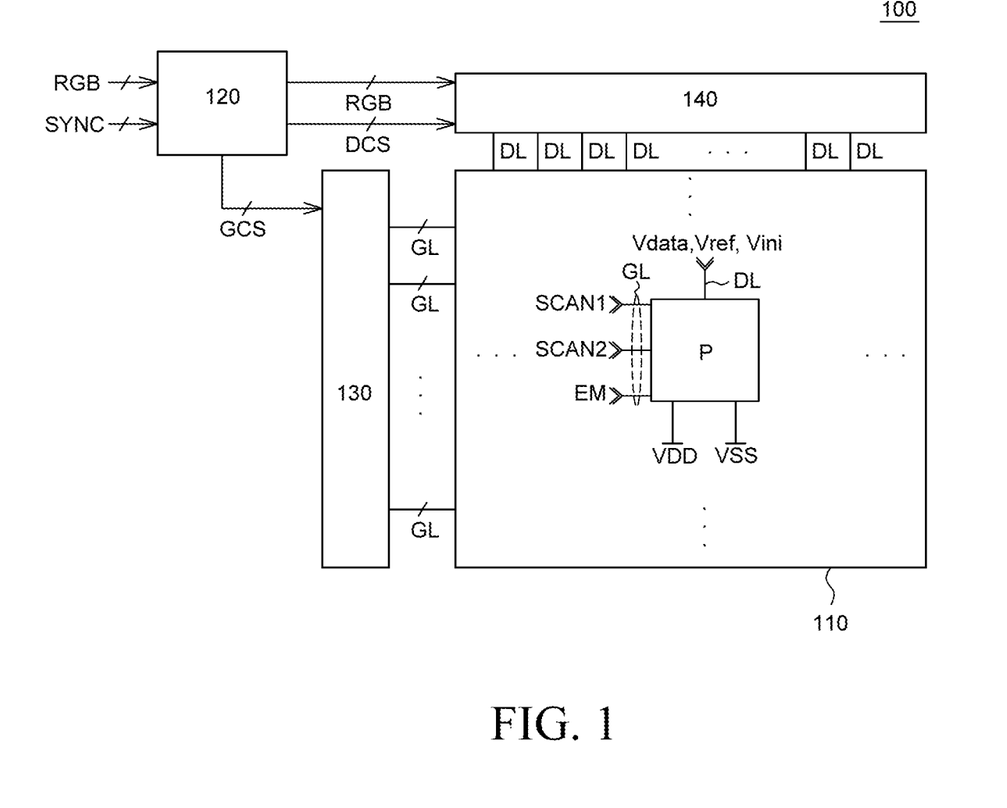
FIG. 1 is a block diagram schematically showing an organic light emitting display according to an aspect of the present disclosure.

FIG. 1 is a block diagram schematically illustrating a display device according to an aspect of the present disclosure. Referring to FIG. 1, an organic light emitting display device 100 includes a display panel 110, a timing controller 120, a gate driver 130, and a data driver 140.

Referring to FIG. 1, an organic light emitting display device 100 may include a display panel 110 including a plurality of pixels P in which organic light emitting elements are disposed, respectively, a gate driver 130 for supplying a gate signal to the organic light emitting element through a gate line GL, a data driver 140 for supplying a video data signal to the organic light emitting element through the data line DL and a timing controller 120 for controlling the data driver 140 and the gate driver 130 in response to the external input signal of the display panel 110 and generating a conversion control signal for controlling the timing of converting a refresh rate of the display panel. In addition, the organic light emitting display device 100 may further include an image processor for receiving a video data input to the display panel 110 and converting the received video data input into a digital signal and supplying the video signal and the control signal to the timing controller 120.

Here, the external input signal refers to a signal for converting the refresh rate of the display panel 110, which is a signal input from the outside of the display panel 110. For example, the external input signal may be a signal that is input by a user pressing an input button connected to the organic light emitting display device 100 or a touch input by a user for selecting a setting for changing the refresh rate of the organic light emitting display device 100. That is, the external input signal is an input signal that is not synchronized (i.e., asynchronized) with the system of the display panel 110, and such asynchronous conversion control signal can be received from an external system electrically connected to the organic light emitting display device 100.

Each of the plurality of pixels P of the organic light emitting display device 100 may include an organic light emitting element having an organic light emitting layer between an anode and a cathode with a pixel driving circuit for independently driving the organic light emitting element.

In detail, the pixel driving circuit may include a drive switching element electrically connected to the organic light emitting element and electrically connected between the high potential supply line (VDD) and the low potential supply line (VSS), a scan switching element electrically connected to the gate of the drive switching element, a sensing switching element electrically connected to the source of the driving switching element, and a storage capacitor electrically connected between the gate of the driving switching element and the source of the driving switching element. Here, the scan switching element may charge a data voltage to the storage capacitor in response to the scan pulse, and the drive switching element may control the amount of current supplied to the organic light emitting element according to the data voltage charged in the storage capacitor, thereby controlling the amount of emitted light (e.g., brightness or luminance).

In FIG. 1, the modules included in the organic light emitting display device 100 are merely illustrative and may be described according to its functions. Accordingly, the module included in the organic light emitting display device 100 may be a combination of at least two modules, or a module may be divided into at least two modules. Thus, the number of modules of the organic light emitting display device 100 may be variously changed. That is, the timing controller 120, the gate driver 130, and the data driver 140 may be implemented as one module or two separate modules.

The gate driver 130 supplies the gate signal GS to the gate line GL in accordance with the gate control signal GCS supplied from the timing controller 120. In the organic light emitting display device 100, the gate signal GS may include at least one scan signal SCAN and an emission control signal EM. In FIG. 1, the gate driver 130 is merely illustrated as being disposed on one side of the display panel 110, but the number of the gate driver 130 and its arrangement are not limited thereto. That is, the gate driver 130 may be disposed on one side or both sides of the display panel 110 with a GIP (gate in panel) configuration.

The data driver 140 converts the image data RGB into the data signal DS according to the data control signal DCS supplied from the timing controller 120 and supplies the converted data signal DS to the pixel through the data line DL.

The timing controller 120 controls the timing of the driving signals input to the display panel 110. In detail, the timing controller 120 processes the image data RGB input from the image processor in accordance with the size and the resolution of the display panel 110 and supplies the processed data to the data driver 140. And, the timing controller 120 may generate gate control signals GCS and data control signals DCS by using a timing control signal which may be synchronization signals SYNC input from the image processor, for example, a dot clock signal DCLK, a data enable signal DE, a horizontal synchronization signal Hsync, and vertical synchronization signal Vsync. The gate driver 130 and the data driver 140 are controlled by supplying a plurality of generated gate control signals GCS and data control signals DCS to the gate driver 130 and the data driver 140, respectively.

The timing controller 120 may generate a conversion control signal PE for controlling the generation of a gate control signal GCS and a data control signal DCS. Here, the conversion control signal PE may be a signal generated by the timing controller 120 to control the switching time at which the refresh rate of the display panel 110 is changed, and may be a signal for changing the state of the refresh rate conversion signal for converting the refresh rate. In this manner, the timing controller 120 may receive the asynchronized conversion control signal at a specific timing, count a number of pulses of the vertical synchronization signal from the input of the conversion control signal up to a predetermined number of pulses, and when the counted pulses of the vertical synchronization signal coincides with the predetermined number of pulses, the display panel can be driven at the refresh rate corresponding to the input conversion control signal. The conversion control signal PE and the refresh rate conversion signal will be described with reference to FIG. 4.

A detailed method of generating the conversion control signal PE and the refresh rate conversion signal by the timing controller 120 will be described with reference to FIG. 2 to FIG. 5.

The organic light emitting display device 100 according to an aspect of the present disclosure controls the gate signal and the data signal by the timing controller 120 according to an external input signal configured to change the refresh rate, and generates a conversion control signal PE for controlling a switch timing of the refresh rate of the display panel 110. As such, the organic light emitting display device 100 can maintain the frame rate of the previous frame from the moment of receiving the external input signal configured to change the refresh rate for a predetermined time or a predetermined frames by the conversion control signal PE generated by the timing controller 120. Accordingly, the organic light emitting display device 100 maintains the output refresh rate unchanged during the frame in which the external input signal is received, whereby when the external input signal is received during one frame, the image blending problem due to the rapid refresh rate change can be prevented. And, the organic light emitting display device 100 can improve the quality of the image displayed by the display panel 110 regardless of an external input signal by a manual input by preventing the image blending which can be visually recognized by the human eye. Hereinafter, the organic light emitting display device according to an aspect of the present disclosure will be described with reference to FIG. 2 to FIG. 4 for detailed descriptions of a specific configuration and a driving method thereof.

Figure 2:
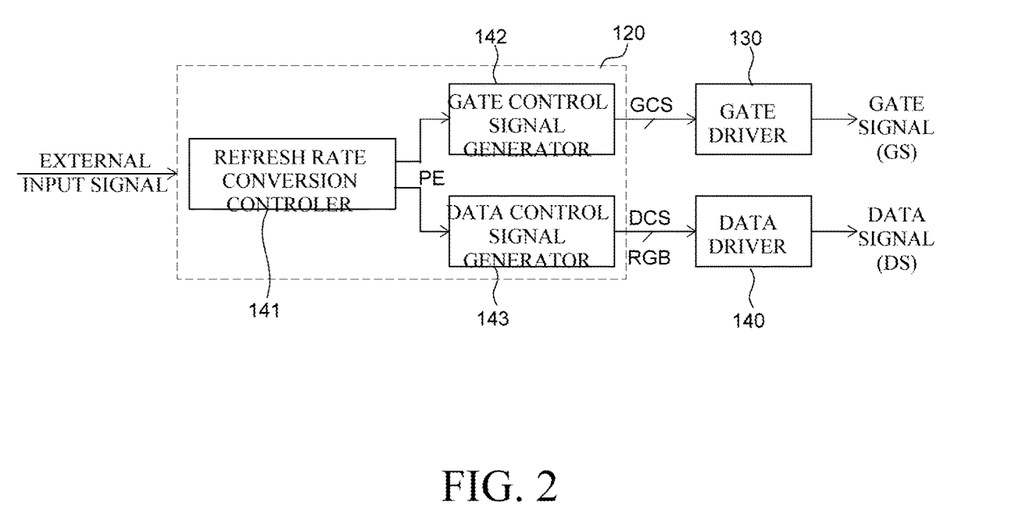
FIG. 2 is a block diagram schematically showing a configuration of a timing controller according to an aspect of the present disclosure.
Figure 3:
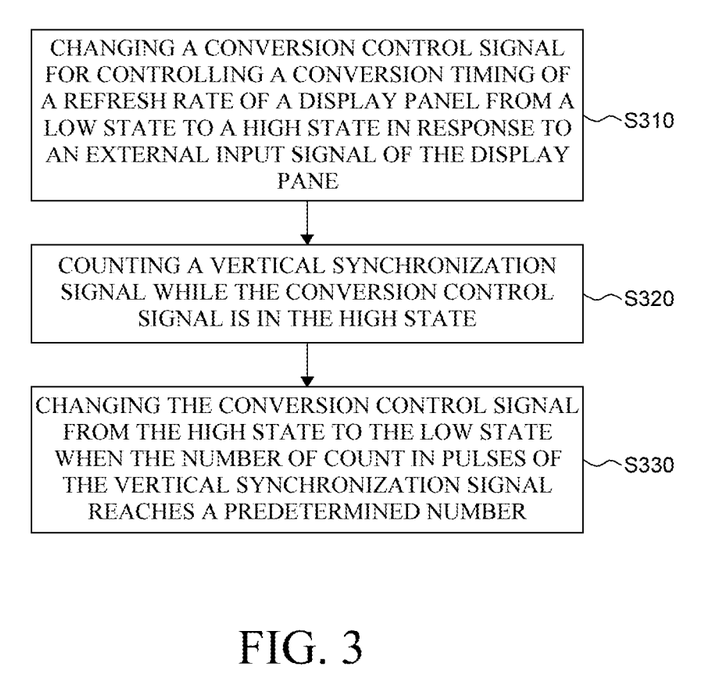
FIG. 3 is a flowchart illustrating a driving method of an organic light emitting display device according to an aspect of the present disclosure.
Figure 4:
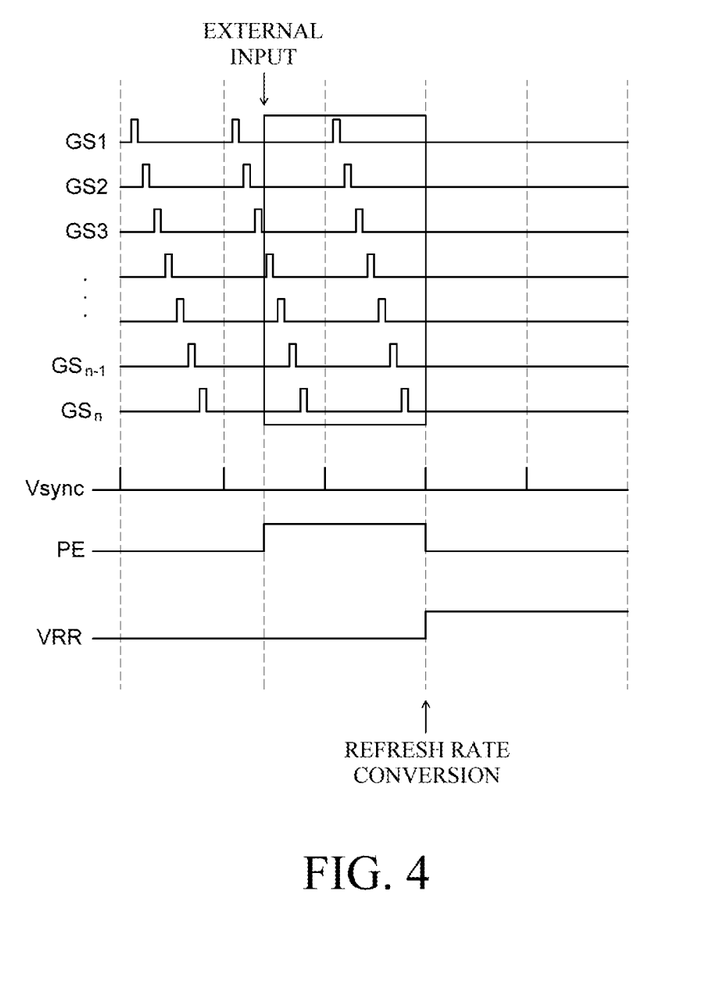
FIG. 4 is an exemplary waveform diagram illustrating a relationship between a vertical synchronization signal, a conversion control signal, and a refresh rate conversion signal according to an aspect of the present disclosure.

FIG. 2 is a block diagram schematically illustrating a configuration of a timing controller according to an aspect of the present disclosure. FIG. 3 is a flowchart illustrating a method of driving an organic light emitting display device according to an aspect of the present disclosure. FIG. 4 is an exemplary waveform diagram illustrating a relationship between a vertical synchronization signal, a conversion control signal, and a refresh rate conversion signal according to an aspect of the present disclosure.

Referring to FIG. 2, the timing controller 120 includes a refresh rate conversion controller 141, a gate control signal generator 142, and a data control signal generator 143. The refresh rate conversion controller 141 generates the conversion control signal PE and the gate control signal generator 142 generates the gate control signal GCS for controlling the output waveform of the gate signal GS by the conversion control signal PE, and the data control signal generator 143 generates the data control signal DCS for controlling the output waveform of the data signal by the conversion control signal PE.

Accordingly, when the timing controller 120 receives the external input signal, the refresh rate conversion controller 141 may transmit the conversion control signal PE to the gate control signal generator 142 for controlling the generation of the gate signal GS and the data control signal generator 143 for controlling the generation of the data signal. The gate control signal generator 142 transmits the gate control signal GCS to the gate driver 130 by the conversion control signal PE and the data control signal generator 143 transmits the data control signal DCS and the image data RGB to the data driving circuit 140 by the conversion control signal PE.

Here, the gate control signal GCS includes a gate shift clock GSC, a gate start pulse GSP, a gate output enable GOE and an emission control signal EM. And, the data control signal DCS includes a data enable signal DE.

Referring to FIG. 3, the timing controller 120 may change state of a conversion control signal PE, for controlling a time point at which the refresh rate of the display panel 110 is changed, from a low state to a high state, in response to an external input signal of the display panel 110 (S310).

Referring to FIG. 2 and FIG. 4, the timing of receiving an external input signal is highly likely to exist between a start point and an end point of one frame.

Thus, the refresh rate conversion controller 141 of the timing controller 120 changes the conversion control signal PE from the low state to the high state at the moment of receiving the external input signal, thereby controlling the gate control signal GCS and the data control signal DCS so as to maintain the output signal GS and the output of the data signal at the moment of receiving the external input signal.

That is, when the refresh rate conversion controller 141 changes the conversion control signal PE from the low state to the high state, thereby the gate control signal generator 142 can be controlled to generate the same gate control signal GCS the same as before when the external input signal is received during the holding period. Accordingly, the gate driver 130 can output the gate signal GS at the same refresh rate as that at the moment when the external input signal is received during the holding period.

Referring to FIG. 3, the timing controller 120 counts the vertical synchronization signal Vsync while the conversion control signal PE is high (S320).

Referring to FIG. 2 and FIG. 4, there is one frame between the previous vertical synchronization signal Vsync and the next vertical synchronization signal Vsync. That is, one synchronization signal (Vsync) pulse represents a start point of one frame. Accordingly, the refresh rate conversion controller 141 may count the number of frames during the holding period by counting the vertical synchronization signal Vsync while the conversion control signal PE is in a high state.

The refresh rate conversion controller 141 may determine the number of frames of the holding period or store the predetermined number of frames of the holding period. Accordingly, the refresh rate conversion controller 141 counts the vertical synchronization signal Vsync while the output of the conversion control signal PE is in a high state, and compare the predetermined number of frames of the holding period and the number of counts of the vertical synchronization signals Vsync.

Accordingly, the refresh rate conversion controller 141 can continuously output the conversion control signal PE as a high state, if the number of counts of the vertical synchronization signal Vsync while the conversion control signal PE is outputting the high state is smaller than a predetermined number (i.e., the number of frames of the predetermined holding period). In addition, the timing controller 140 may be configured not to apply a new data signal voltage to the display panel 110 while counting pulses of the vertical synchronization signal Vsync.

Here, the number of frames of the predetermined holding period may be two. For example, if the external input signal is received between the start point and the end point of one frame, the refresh rate conversion controller 141 counts one vertical synchronization signal Vsync at the end point of the frame including the moment when the external input signal is received. Accordingly, if the predetermined number of frames of the holding period is 2, then that will be the end point of the next frame of the frame including the moment when the external input signal is received. That is, the holding period is from the moment the external input signal is received until the end point of the next frame of the frame including the moment when the external input signal is received.

Accordingly, the timing controller 120 can control to output the gate signal GS at the same refresh rate only until the frame including the moment when the external input signal is received and the next frame. The same refresh rate is maintained until the next frame of the frame including the moment when the external input signal is received, thereby preventing image blending due to rapid refresh rate conversion.

Referring to FIG. 3, the timing controller 120 changes the conversion control signal PE from a high state to a low state at a moment when the number of counts of the vertical synchronization signal Vsync reaches a predetermined number (S330).

Referring to FIG. 2 and FIG. 4, the refresh rate conversion controller 141 can generate the refresh rate conversion signal VRR that converts the refresh rate of the display panel 110 in response to the conversion control signal PE. The output waveform of the gate signal GS output from the gate driver 130 and the data signal output from the data driver 140 can be changed as the state of the refresh rate conversion signal VRR is changed. The change in the specific output waveform of the gate signal GS and the data signal according to the refresh rate conversion signal VRR will be described with reference to FIG. 5.

The refresh rate conversion controller 141 may change the conversion control signal PE from the high state to the low state at a moment when the counted number of the vertical synchronization signal Vsync becomes equal to the predetermined number of frames of the holding period, then the refresh rate conversion signal VRR can be changed from a low state to a high state. The refresh rate conversion controller 141 outputs the refresh rate conversion signal VRR in a high state to inform the gate control signal generator 142 and the data control signal generator 143 the moment when the refresh rate is converted. That is, the conversion control signal PE is changed from the high state to the low state, the refresh rate conversion signal VRR is changed from the low state to the high state, and the gate control signal generator 142 and the data control signal generator 143 output the gate control signal GCS and the data control signal DCS to convert the refresh rate, respectively. Thus, the refresh rate is converted corresponding to the external input signal when the refresh rate conversion signal VRR is changed from the low state to the high state.

The organic light emitting display device 100 according to an aspect of the present disclosure includes a timing controller for receiving an external input signal and controlling the refresh rate not to be changed during a holding period including a predetermined frame. Accordingly, the timing controller 120 can control the gate driver 130 and the data driver 140 to maintain the refresh rate for certain frames from the receiving moment of the external input signal for the refresh rate conversion. Accordingly, it is possible to improve the image blending problem cause by the change of the refresh rate at the moment of receiving the external input signal, thereby improving the image quality of the organic light emitting display device 100.

Figure 5:
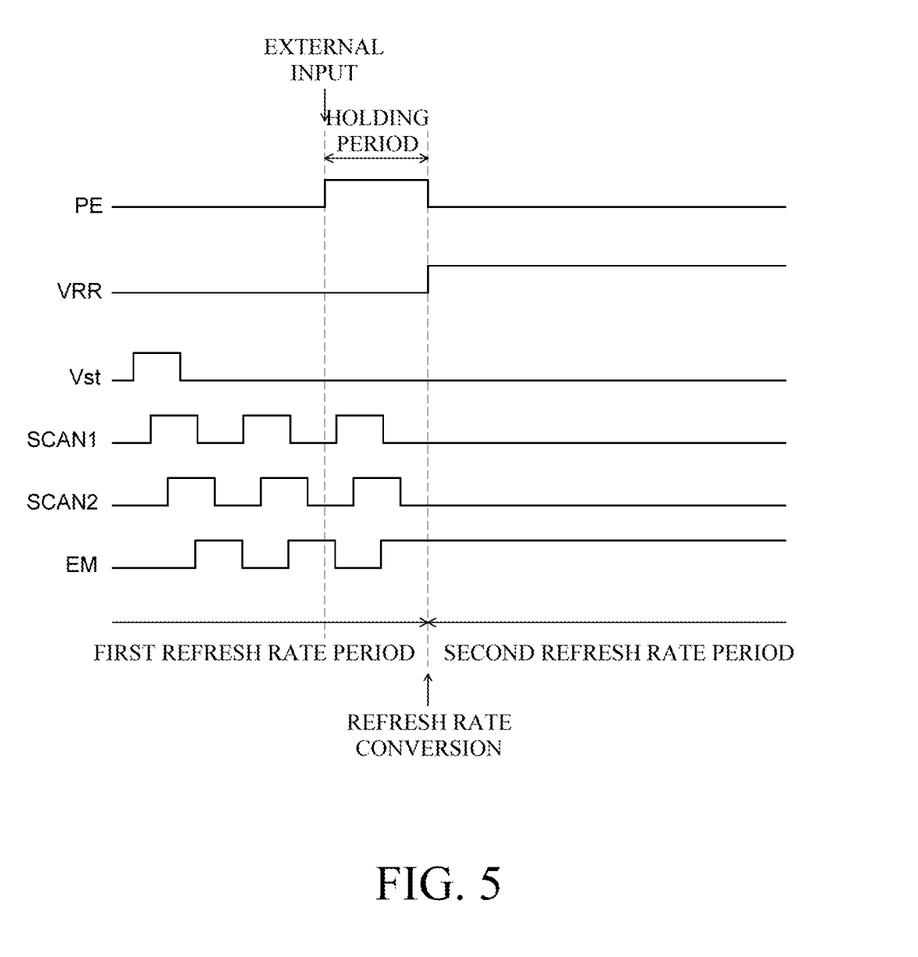
FIG. 5 is an exemplary waveform diagram of a gate signal and a data signal output by a conversion control signal and a refresh rate conversion signal according to an aspect of the present disclosure.

FIG. 5 is an exemplary waveform diagram of a gate signal and a data signal output by a conversion control signal and a refresh rate conversion signal according to an aspect of the present disclosure. For convenience of description, FIG. 2 and FIG. 4 will be described.

Between the moment the external input signal is received and the instant when the refresh rate conversion signal VRR is changed from the low state to the high state, the timing controller 120 controls the gate driver 130 and the data driver 140 to output the gate signal GS and the data signal in the same manner as before the moment when the conversion control signal PE is changed from the low state to the high state. Between the instant when the external input signal is received and the instant when the refresh rate conversion signal VRR is changed from the low state to the high state, the gate signal GS and the data signal remain the same as before the moment when the conversion control signal PE is changed from the low state to the high state.

Thus, during the holding period, the gate signals GS1 and GS2 and the emission control signal EM are output at the same refresh rate as before the external input signal is received.

Next, the timing controller 120 outputs the refresh rate conversion signal VRR in the high state, thereby controlling the gate signal and the data signal to be outputted at the refresh rate corresponding to the external input signal. In detail, the timing controller 120 outputs the refresh rate conversion signal VRR in a high state. Therefore, it is possible to control the gate control signal generator 142 and the data control signal generator 143 to output the gate signal and the data signal at the converted refresh rate.

Referring to FIG. 5, after the refresh rate conversion signal VRR is changed to the high state, the refresh rate of the display panel 110 is changed, and the output waveforms of the scan signals SCAN1 and SCAN2 are also changed. In FIG. 5, the first refresh rate period includes a period before the external input signal is received and a holding period, and the second refresh rate period refers to a period after the instant when the refresh rate is converted. As the refresh rate is converted, the interval of the turn-off period of the vertical synchronization signal can be adjusted according to the refresh rate corresponding to the conversion control signal.

For example, in the first refresh rate period, the refresh rate conversion signal VRR is in a low state, and depends on the refresh rate before receiving the external input signal, the output waveforms of the scan signals SCAN1 and SCAN2 may represent the swing waveform of the high state and the low state. On the other hand, in the second refresh rate period, the refresh rate conversion signal VRR is in the high state and the scan signals SCAN1 and SCAN2 corresponding to the refresh rate according to the external input signal are output. In FIG. 5, the refresh rate of the first refresh rate period is shown to be higher than the refresh rate of the second refresh rate period. But the present disclosure is not limited thereto and the refresh rate of the second refresh rate period may be higher than the refresh rate of the first refresh rate period. That is, before the external input signal is received, the scan signals SCAN1 and SCAN2 are output at a lower refresh rate, and after the holding period, the scan signals SCAN1 and SCAN2 are output at a higher refresh rate from the point at which the refresh rate conversion signal VRR is changed to a high state.

The organic light emitting display device 100 according to an aspect of the present disclosure includes a timing controller 120 for maintaining the same refresh rate as that before the external input signal is received for a predetermined period or a predetermined frame with respect to the external input signal for changing the refresh rate.

Accordingly, the timing controller 120 maintains the refresh rate for a predetermined period in response to the manual input for changing the refresh rate by the user, thereby suppressing the generation of the image data output due to the abrupt change in the refresh rate with different refresh rates in one frame. That is, the timing controller 120 can also suppress the output of the image data with blending phenomenon that can be visually recognized by the human eye due to different refresh rates in one frame, whereby the output image quality of the organic light emitting display device 100 can be improved.

The aspects of the present disclosure can also be described as follows:

According to an aspect of the present disclosure, an organic light emitting display device according to an aspect of the present disclosure comprises a display panel including a plurality of pixels, each pixel including an organic light emitting element, a data driver supplying a data signal to the organic light emitting element through a data line, a gate driver supplying a gate signal to the organic light emitting element through a gate line and a timing controller controlling an operation timing of the data driver and an operation timing of the gate driver, and generating a conversion control signal controlling a conversion timing of a refresh rate of the display panel in response to an external input signal of the display panel. An organic light emitting display device according to an aspect of the present disclosure, it is possible to suppress the image mixing problem in the refresh rate conversion in the organic light emitting display device by generating a conversion control signal for controlling the refresh rate conversion in accordance with the user's refresh rate conversion input.

According to one or more aspects of the present disclosure, timing controller may include a refresh rate conversion controller generating the conversion control signal, a gate control signal generator generating a gate control signal to control an output waveform of the gate signal in response to the conversion control signal, and a data control signal generator generating a data control signal to control an output waveform of the data signal in response to the conversion control signal.

According to one or more aspects of the present disclosure, the refresh rate conversion controller may change the conversion control signal from a low state to a high state when the external input signal is received by the refresh rate conversion controller, and the refresh rate conversion controller change the conversion control signal from the high state to the low state when the number of count in pulses of vertical synchronization signals reaches a predetermined number of pulses while the conversion control signal remains in the high state.

According to one or more aspects of the present disclosure, the conversion control signal may prevent an image blend phenomenon on the display panel caused by a refresh rate conversion in response to the external input signal.

According to one or more aspects of the present disclosure, the predetermined number may be 2.

According to one or more aspects of the present disclosure, the refresh rate conversion controller may generate a refresh rate conversion signal to change the refresh rate of the display panel in response to the conversion control signal. And the refresh rate conversion signal may be changed from a low state to a high state when the conversion control signal is changed from the high state to the low state.

According to one or more aspects of the present disclosure, the conversion control signal may suppress image blending problem of the image output from the display panel due to the refresh rate conversion in response to the external input signal.

According to one or more aspects of the present disclosure, the timing controller may control the gate driver and the data driver to maintain the gate signal and the data signal the same as the gate signal and the data signal before the conversion control signal is changed from the low state to the high state during a time between the external input signal is received at the refresh rate conversion controller and the refresh rate conversion signal is changed from the low state to the high state.

According to another aspect of the present disclosure, a driving method of an organic light emitting display device according to an aspect of the present disclosure comprises changing a conversion control signal to control a conversion timing of a refresh rate of a display panel from a low state to a high state in response to an external input signal of the display panel, counting a vertical synchronization signal while the conversion control signal is in the high state, and changing the conversion control signal from the high state to the low state when the number of count in pulses of the vertical synchronization signal reaches a predetermined number of pulses. The driving method of the organic light emitting display device according to an aspect of the present disclosure can reduce the power consumption of the organic light emitting display device and reduce the image blending phenomenon by maintaining the driving frequency of before reception of the external input signal until the next frame after reception of the external input signal in response to an external input signal for refresh rate conversion.

According to one or more aspects of the present disclosure, a driving method of an organic light emitting display device may further include a step for changing a time point at which a black gradation data voltage is supplied so that a compensation period is not overlapped with a time point at which a black gradation data voltage is supplied.

According to one or more aspects of the present disclosure, a driving method may further include a step for changing a refresh rate conversion signal for changing the refresh rate from a low state to a high state when the conversion control signal is changed from the high state to the low state.

According to one or more aspects of the present disclosure, the predetermined number may be 2.

According to one or more aspects of the present disclosure, a gate signal and a data signal supplied to a plurality of pixels on the display panel may be maintained to be the same as the gate signal and the data signal before the conversion control signal is changed from the low state to the high state during a time between the external input signal is received at the refresh rate conversion controller to a time and the refresh rate conversion signal is changed from the low state to the high state.

According to another aspect of the present disclosure, an organic light emitting display device according to an aspect of the present disclosure includes a display panel including a plurality of pixels and a timing controller adjusting a refresh rate of the display panel by applying a vertical synchronization signal having an adjustable refresh rate to the plurality of pixels according to an asynchronized conversion control signal. The timing controller receives the asynchronized conversion control signal at a specific timing, counts the number of pulses of the vertical synchronization signal after an input of the conversion control signal until a predetermined number of pulses is reached, and drives the display panel at a refresh rate corresponding to the conversion control signal when the counted number of pulses of the vertical synchronization signal is equal to the predetermined number of pulses.

According to one or more aspects of the present disclosure, the asynchronous conversion control signal, may be received from an external system electrically connected to the organic light emitting display device.

According to one or more aspects of the present disclosure, the vertical synchronization signal may have an interval of a turn-off period adjusted according to the refresh rate corresponding to the conversion control signal.

According to one or more aspects of the present disclosure, the timing controller may do not apply a new data voltage to the display panel during counting the pulses of the vertical synchronization signal.

According to one or more aspects of the present disclosure, the timing controller may include a refresh rate conversion controller generating the conversion control signal, a gate control signal generator generating a gate control signal for to control an output waveform of the gate signal in response to the conversion control signal, and a data control signal generator generating a data control signal for to control an output waveform of the data signal in response to the conversion control signal.

Although the aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purpose only but not intended to limit the technical concept of the present disclosure. The protective scope of the present disclosure should be construed based on the following claims and all the technical concepts in the equivalent scope thereof should be construed as falling within the scope of the present disclosure.

What is claimed is:

1. An organic light emitting display device comprising:
   a display panel including a plurality of pixels, each pixel including an organic light emitting element;
   a data driver supplying a data signal to the organic light emitting element through a data line;
   a gate driver supplying a gate signal to the organic light emitting element through a gate line; and
   a timing controller including a refresh rate conversion controller generating the conversion control signal, controlling an operation timing of the data driver and an operation timing of the gate driver, and generating a conversion control signal controlling a conversion timing of a refresh rate of the display panel in response to an external input signal of the display panel wherein the refresh rate conversion controller changes the conversion control signal from a low state to a high state when the external input signal is received by the refresh rate conversion controller, and the refresh rate conversion controller changes the conversion control signal from the high state to the low state when the number of count in pulses of vertical synchronization signals reaches a predetermined number of pulses while the conversion control signal remains in the high state.

2. The organic light emitting display device of claim 1, wherein the timing controller further includes:
a gate control signal generator generating a gate control signal to control an output waveform of the gate signal in response to the conversion control signal; and
a data control signal generator generating a data control signal to control an output waveform of the data signal in response to the conversion control signal.

3. The organic light emitting display device of claim 1, wherein the conversion control signal prevents an image blend phenomenon on the display panel caused by a refresh rate conversion in response to the external input signal.

4. The organic light emitting display device of claim 1, wherein the predetermined number is 2.

5. The organic light emitting display device of claim 1, wherein the refresh rate conversion controller generates a refresh rate conversion signal to change the refresh rate of the display panel in response to the conversion control signal, and
wherein the refresh rate conversion signal is changed from a low state to a high state when the conversion control signal is changed from the high state to the low state.

6. The organic light emitting display device of claim 5, the timing controller controls the gate driver and the data driver to maintain the gate signal and the data signal the same as the gate signal and the data signal before the conversion control signal is changed from the low state to the high state during a time between the external input signal is received at the refresh rate conversion controller and the refresh rate conversion signal is changed from the low state to the high state.

7. A driving method of an organic light emitting display device, comprising:
changing a conversion control signal to change a conversion timing of a refresh rate of a display panel from a low state to a high state in response to an external input signal of the display panel;
counting a vertical synchronization signal while the conversion control signal is in the high state; and
changing the conversion control signal from the high state to the low state when the number of count in pulses of the vertical synchronization signal reaches a predetermined number of pulses.

8. The driving method of claim 7, further comprising changing a refresh rate conversion signal for changing the refresh rate from a low state to a high state when the conversion control signal is changed from the high state to the low state.

9. The driving method of claim 7, wherein the predetermined number of pulses is 2.

10. The driving method of claim 7, wherein a gate signal and a data signal supplied to a plurality of pixels on the display panel are maintained to be the same as the gate signal and the data signal before the conversion control signal is changed from the low state to the high state during a time between the external input signal is received at the refresh rate conversion controller to a time and the refresh rate conversion signal is changed from the low state to the high state.

11. An organic light emitting display device comprising:
a display panel including a plurality of pixels; and
a timing controller adjusting a refresh rate of the display panel by applying a vertical synchronization signal having an adjustable refresh rate to the plurality of pixels according to an asynchronized conversion control signal,
wherein the timing controller receives the asynchronized conversion control signal at a specific timing,
counts the number of pulses of the vertical synchronization signal after an input of the conversion control signal until a predetermined number of pulses is reached, and
drives the display panel at a refresh rate corresponding to the conversion control signal when the counted number of pulses of the vertical synchronization signal is equal to the predetermined number of pulses.

12. The organic light emitting display device of claim 11, wherein the asynchronized conversion control signal is received from an external system electrically connected to the organic light emitting display device.

13. The organic light emitting display device of claim 11, wherein the vertical synchronization signal has an interval of a turn-off period adjusted according to the refresh rate corresponding to the conversion control signal.

14. The organic light emitting display device of claim 11, wherein the timing controller does not apply a new data voltage to the display panel during counting the pulses of the vertical synchronization signal.

15. The organic light emitting display device of claim 11, wherein the conversion control signal prevents an image blend phenomenon on the display panel caused by a refresh rate conversion in response to the external input signal.

16. The organic light emitting display device of claim 11, wherein the predetermined number of pulses is 2.

17. The organic light emitting display device of claim 11, wherein the refresh rate conversion controller generates a refresh rate conversion signal to change the refresh rate of the display panel in response to the conversion control signal, wherein the refresh rate conversion signal is changed from a low state to a high state when the conversion control signal is changed from the high state to the low state.

18. The organic light emitting display device of claim 11, the timing controller controls the gate driver and the data driver to maintain the gate signal and the data signal the same as the gate signal and the data signal before the conversion control signal is changed from the low state to the high state during a time between the external input signal is received at the refresh rate conversion controller and the refresh rate conversion signal is changed from the low state to the high state.

19. The organic light emitting display device of claim 11, wherein the timing controller includes:
a refresh rate conversion controller generating the conversion control signal;
a gate control signal generator generating a gate control signal for to control an output waveform of the gate signal in response to the conversion control signal; and
a data control signal generator generating a data control signal for to control an output waveform of the data signal in response to the conversion control signal.

* * * * *